US012136691B2

(12) United States Patent
Tang et al.

(10) Patent No.: US 12,136,691 B2
(45) Date of Patent: Nov. 5, 2024

(54) SYSTEM WITH ONE-WAY FILTER OVER LIGHT-EMITTING ELEMENTS

(71) Applicant: Apple Inc., Cupertino, CA (US)

(72) Inventors: Xiaofeng Tang, Santa Clara, CA (US); Bryce E Wallis, Palo Alto, CA (US); Christopher P Child, San Jose, CA (US); Clarisse Mazuir, San Jose, CA (US); Kurt R Stiehl, Los Gatos, CA (US); Rong Liu, Sunnyvale, CA (US); Yong Seok Choi, Pleasanton, CA (US); Yu P Sun, Yorba Linda, CA (US)

(73) Assignee: Apple Inc., Cupertino, CA (US)

( * ) Notice: Subject to any disclaimer, the term of this patent is extended or adjusted under 35 U.S.C. 154(b) by 131 days.

(21) Appl. No.: 18/145,489

(22) Filed: Dec. 22, 2022

(65) Prior Publication Data

US 2023/0231090 A1 Jul. 20, 2023

Related U.S. Application Data

(60) Provisional application No. 63/300,529, filed on Jan. 18, 2022.

(51) Int. Cl.
*H01L 33/60* (2010.01)
*F21S 43/14* (2018.01)
(Continued)

(52) U.S. Cl.
CPC .............. *H01L 33/60* (2013.01); *F21S 43/14* (2018.01); *F21S 43/26* (2018.01); *F21S 43/30* (2018.01);
(Continued)

(58) Field of Classification Search
CPC ........ H01L 33/60; H01L 27/156; F21S 43/14; F21S 43/26; F21S 43/30
See application file for complete search history.

(56) References Cited

U.S. PATENT DOCUMENTS 6,885,968 B2   4/2005   Breed et al.
7,852,462 B2   12/2010  Breed et al.
(Continued)

FOREIGN PATENT DOCUMENTS

EP   1630575 A1   3/2006
EP   3332610 B1   1/2020

*Primary Examiner* — Christopher E Dunay
(74) *Attorney, Agent, or Firm* — Treyz Law Group, P.C.; Joseph F. Guihan

(57) ABSTRACT

A system may have an exterior display. The exterior display may display symbols that correspond to intended actions for the system or instructions for nearby viewers. The exterior display may include an array of light-emitting diodes, a collimator, a one-way filter to prevent sunlight from washing out the display, and a cover layer. The one-way filter may include a microlens array and a masking layer. The collimator is configured to collimate light from the array of light-emitting diodes and provide the collimated light to the one-way filter. The microlens array receives the collimated light and focuses the collimated light through a plurality of holes in the masking layer. In this way, the majority of display light is passed through the one-way filter towards a viewer. However, the majority of ambient sunlight is blocked by the masking layer, thus preserving a high contrast for the exterior display even in bright sunlight.

17 Claims, 8 Drawing Sheets

(51) Int. Cl.
*F21S 43/20* (2018.01)
*F21S 43/30* (2018.01)
*H01L 27/15* (2006.01)
*F21Y 115/10* (2016.01)

(52) U.S. Cl.
CPC ......... H01L 27/156 (2013.01); *F21Y 2115/10* (2016.08)

(56) References Cited

U.S. PATENT DOCUMENTS

| | | |
|---|---|---|
| 8,120,652 B2 | 2/2012 | Bechtel et al. |
| 10,331,939 B2 | 6/2019 | He et al. |
| 10,464,476 B1 | 11/2019 | Mazuir et al. |
| 11,002,066 B2 | 5/2021 | Wilson et al. |
| 11,104,267 B1 | 8/2021 | Mazuir et al. |
| 2001/0019378 A1* | 9/2001 | Yamaguchi .......... G02B 3/0031 349/61 |
| 2009/0004822 A1* | 1/2009 | Murakami .......... H01L 27/1214 438/458 |
| 2009/0009861 A1 | 1/2009 | Hyobu |
| 2010/0014313 A1* | 1/2010 | Tillin ................ G02B 27/0101 359/619 |
| 2016/0265733 A1* | 9/2016 | Bauer .................... F21S 41/16 |
| 2018/0129798 A1 | 5/2018 | He et al. |
| 2018/0149907 A1* | 5/2018 | Gahagan .......... G02F 1/133504 |
| 2020/0369007 A1* | 11/2020 | Bauerle ................ B32B 37/12 |
| 2021/0223568 A1* | 7/2021 | Makinen .............. H04N 13/349 |
| 2022/0065425 A1* | 3/2022 | Cornelissen ............ F21V 11/14 |

* cited by examiner

SYSTEM WITH ONE-WAY FILTER OVER LIGHT-EMITTING ELEMENTS

This application claims priority to U.S. provisional patent application No. 63/300,529, filed Jan. 18, 2022, which is hereby incorporated by reference herein in its entirety.

FIELD

This relates generally to systems and, more particularly, systems that have light-emitting elements.

BACKGROUND

Some systems have external output devices such as light-emitting elements. However, these external output devices may be limited in the type of information they can convey. These external output devices may also have worse contrast than desired in bright ambient light.

SUMMARY

A vehicle may have an exterior display. The exterior display may display symbols that correspond to intended actions for the vehicle or symbols that correspond to instructions for nearby pedestrians.

The exterior display may include an array of light-emitting diodes, a collimator, a one-way filter to prevent ambient sunlight from washing out the display, and a cover layer. The one-way filter may include a microlens array and a masking layer. The collimator is configured to collimate light from the array of light-emitting diodes and provide the collimated light to the one-way filter.

The microlens array in the one-way filter receives the collimated light and focuses the collimated light through a plurality of holes in the masking layer. In this way, the majority of display light is passed through the one-way filter towards a viewer. However, the majority of ambient sunlight is blocked by the masking layer, thus preserving a high contrast for the exterior display even in bright sunlight.

The masking layer in the exterior display may be formed by a black material (giving the display a black appearance in its off state). Alternatively, the masking layer may be a non-black color to provide a non-black appearance in the off state. As yet another option, the masking layer may have a high specular reflection. With this type of arrangement, ambient sunlight is reflected towards the ground (away from the viewer) to preserve display contrast and the display has a mirror-like appearance in the off state.

The exterior display may optionally include a color conversion layer, a filtering layer, and/or a supplemental diffuser layer. The exterior display may have a planar output surface (with corresponding planar display layers) or a non-planar output surface (with corresponding non-planar display layers).

DETAILED DESCRIPTION

A system such as a vehicle or other system may have components that emit light. The components may include an exterior display that displays symbols and/or other information. The exterior display for a vehicle may be viewable by pedestrians or nearby vehicles and may signal the intentions of the vehicle. For example, the exterior display may display a stop symbol when the vehicle is about to stop or in the act of stopping.

The exterior display may routinely be operated in daytime conditions where sunlight levels are very high. If care is not taken, the bright sunlight may reduce contrast and wash out the display content. To preserve contrast in an exterior display, the display may be covered by a one-way filter that includes a microlens array and a mask with a plurality of holes. The microlens array may focus display light through the holes in the mask, allowing the display light to be visible to a viewer. At the same time, the mask may block the majority of sunlight, preventing reflections from washing out the display light.

Figure 1:
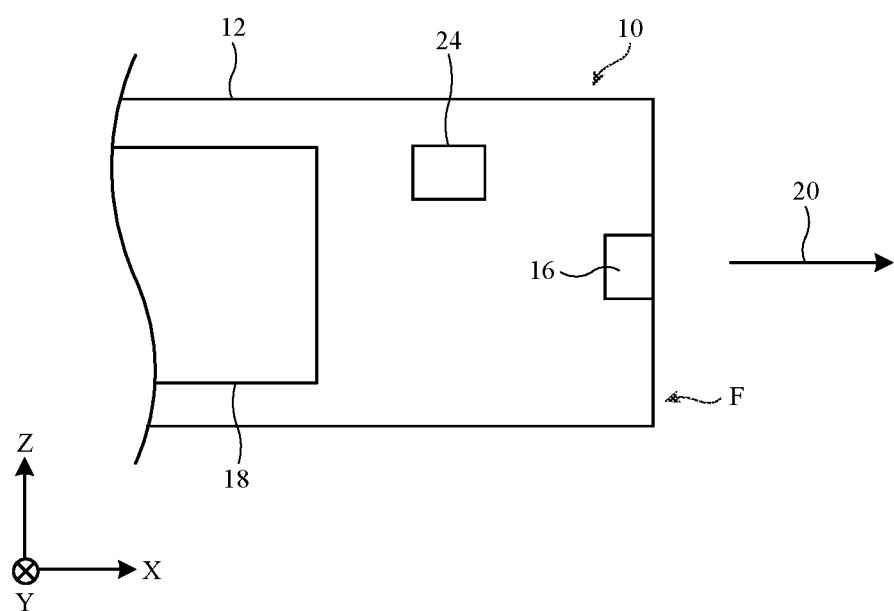
FIG. 1 is a side view of an illustrative vehicle in accordance with an embodiment.

FIG. 1 is a side view of a portion of an illustrative vehicle. In the example of FIG. 1, vehicle 10 is the type of vehicle that may carry passengers (e.g., an automobile, truck, or other automotive vehicle). Configurations in which vehicle 10 is a robot (e.g., an autonomous robot) or other vehicle that does not carry human passengers may also be used. Vehicles such as automobiles may sometimes be described herein as an example.

Vehicle 10 may be manually driven (e.g., by a human driver), may be operated via remote control, and/or may be autonomously operated (e.g., by an autonomous driving system or other autonomous propulsion system). Using vehicle sensors such as lidar, radar, visible and/or infrared cameras (e.g., two-dimensional and/or three-dimensional cameras), proximity (distance) sensors, and/or other sensors, an autonomous driving system and/or driver-assistance system in vehicle 10 may perform automatic braking, steering, and/or other operations to help avoid pedestrians, inanimate objects, and/or other external structures on roadways.

Vehicle 10 may include a body such as vehicle body 12. Body 12 may include vehicle structures such as body panels formed from metal and/or other materials, may include doors 18, a hood, a trunk, fenders, a chassis to which wheels are mounted, a roof, etc. Windows may be formed in doors 18 and other portions of vehicle body 12 (e.g., on the sides of vehicle body 12, on the roof of vehicle 10, and/or in other portions of vehicle 10). Windows, doors 18, and other portions of body 12 may separate the interior of vehicle 10 from the exterior environment that is surrounding vehicle 10. Doors 18 may be opened and closed to allow people to enter and exit vehicle 10. Seats and other structures may be formed in the interior of vehicle body 12.

Vehicle 10 may have automotive lighting such as one or more headlights (sometimes referred to as headlamps), driving lights, fog lights, daytime running lights, turn signals, brake lights, and/or other lights. In some cases, vehicle 10 may include an exterior display that is configured to display content at the exterior of the vehicle. As shown in FIG. 1, for example, vehicle 10 may have an exterior display such as display 16. In general, display 16 may be mounted on front F of vehicle 10, on an opposing rear portion of vehicle 10, on the left and/or right sides of vehicle 10, and/or on other portions of body 12. In an illustrative configuration, which may sometimes be described herein as an example, display 16 is mounted to front F of body 12. Display 16 may, for example, emit illumination 20 in the forward direction (e.g., in the +X direction in which vehicle 10 moves when driven forward in the example of FIG. 1).

A wide variety of content may be displayed on display 16. If desired, display 16 may be used to communicate with pedestrians or others nearby. Display 16 may display instructions or indicators for pedestrians. As an example, pedestrians may be waiting to cross in front of vehicle 10 after vehicle 10 has come to a stop at a crosswalk. To help inform the pedestrians that it is safe to cross, vehicle 10 may use display 16 to display an animation or image of a person walking. Alternatively, display 16 may display a green light or arrow to indicate safe crossing conditions. As yet another example, display 16 may convey an intended action for vehicle 10. When vehicle 10 is in the process of stopping, about to stop, or actively stopped, display 16 may display an image of a stop sign, a symbol associated with stopping (e.g., a square or a red square), the word "stop" or "stopping" in text form, or another desired indicator. In general, any desired image or content may be displayed on display 16 to provide information to people in the vicinity of vehicle 10.

Display 16 may have a viewing angle that is aligned with likely positions of pedestrians relative to vehicle 10. If desired, multiple displays 16 may be positioned on the front of vehicle 10. A first display may be positioned on the left side of the front of the vehicle and may be configured to display content towards the front-left of the vehicle. A second display may be positioned on the right side of the front of the vehicle and may be configured to display content towards the front-right of the vehicle. This example is merely illustrative. In general, vehicle 10 may include any desired number of exterior displays 16 at any desired position(s) on the body of the vehicle.

Vehicle 10 may have components 24. Components 24 may include propulsion and steering systems (e.g., manually adjustable driving systems and/or autonomous driving systems having wheels coupled to body 12, steering controls, one or more motors for driving the wheels, etc.), and other vehicle systems. Components 24 may include control circuitry and input-output devices. Control circuitry in components 24 may be configured to run an autonomous driving application, a navigation application (e.g., an application for displaying maps on a display), and software for controlling vehicle climate control devices, lighting, media playback, window movement, door operations, sensor operations, and/or other vehicle operations. For example, the control system may form part of an autonomous driving system that drives vehicle 10 on roadways autonomously using data such as sensor data. The control circuitry may include processing circuitry and storage and may be configured to perform operations in vehicle 10 using hardware (e.g., dedicated hardware or circuitry), firmware and/or software. Software code for performing operations in vehicle 10 and other data is stored on non-transitory computer readable storage media (e.g., tangible computer readable storage media) in the control circuitry. The software code may sometimes be referred to as software, data, program instructions, computer instructions, instructions, or code. The non-transitory computer readable storage media may include non-volatile memory such as non-volatile random-access memory, one or more hard drives (e.g., magnetic drives or solid-state drives), one or more removable flash drives or other removable media, or other storage. Software stored on the non-transitory computer readable storage media may be executed on the processing circuitry of components 24. The processing circuitry may include application-specific integrated circuits with processing circuitry, one or more microprocessors, a central processing unit (CPU) or other processing circuitry.

The input-output devices of components 24 may include displays, light-emitting diodes and other light-emitting devices, haptic devices, speakers, and/or other devices for providing output. Output devices in components 24 may, for example, be used to provide vehicle occupants and others with haptic output, audio output, visual output (e.g., displayed content, light, etc.), and/or other suitable output. The input-output devices of components 24 may also include input devices such as buttons, sensors, and other devices for gathering user input, for gathering environmental measurements, for gathering information on vehicle operations, and/or for gathering other information. The sensors in components 24 may include ambient light sensors, touch sensors, force sensors, proximity sensors, optical sensors such as cameras operating at visible, infrared, and/or ultraviolet wavelengths (e.g., fisheye cameras, two-dimensional cameras, three-dimensional cameras, and/or other cameras), capacitive sensors, resistive sensors, ultrasonic sensors (e.g., ultrasonic distance sensors), microphones, radio-frequency sensors such as radar sensors, lidar (light detection and ranging) sensors, door open/close sensors, seat pressure sensors and other vehicle occupant sensors, window sensors, position sensors for monitoring location, orientation, and movement, speedometers, satellite positioning system sensors, and/or other sensors.

During operation, the control circuitry of components 24 may gather information from sensors and/or other input-output devices such as lidar data, camera data (e.g., two-dimensional images), radar data, and/or other sensor data. This information may be used by an autonomous driving system and/or driver's assistance system in vehicle 10. Based on these measurements, user input, or other information, vehicle 10 may adjust exterior display 16.

A vehicle occupant or other user of vehicle 10 may provide user input to the control circuitry of vehicle 10. Cameras, touch sensors, physical controls, and other input devices may be used to gather the user input. Using wireless communications with vehicle 10, remote data sources may provide the control circuitry of components 24 with database information. If desired, display 16 and/or other vehicle components may be adjusted based on user input and/or information from a remote data source. For example, information on road conditions (e.g., road size, road type, road shape, road surface, etc.) may be stored in a remote database and this information may be provided to vehicle 10 over a wireless communications link. During operation, vehicle 10 may adjust display 16 based on the road condition information.

Display 16 may have two-dimensional arrays of components. Display 16 may, for example, have arrays of light-emitting diodes and/or other light sources. The arrays may be arranged to form two-dimensional arrays with rows and columns or may be arranged with other two-dimensional layouts.

Because display 16 is positioned at the exterior of vehicle 10, the display may be exposed to high levels of sunlight during daytime operation. If care is not taken, sunlight may reduce contrast in display 16 and wash out the display content. To preserve contrast in display 16 in bright sunlight, the display may be covered by a one-way filter. The one-way filter may allow the majority of display light to pass through the filter to the display viewer(s). The one-way filter may prevent the majority of ambient sunlight from reflecting off the display and also being viewable the display viewer(s).

Figure 2:
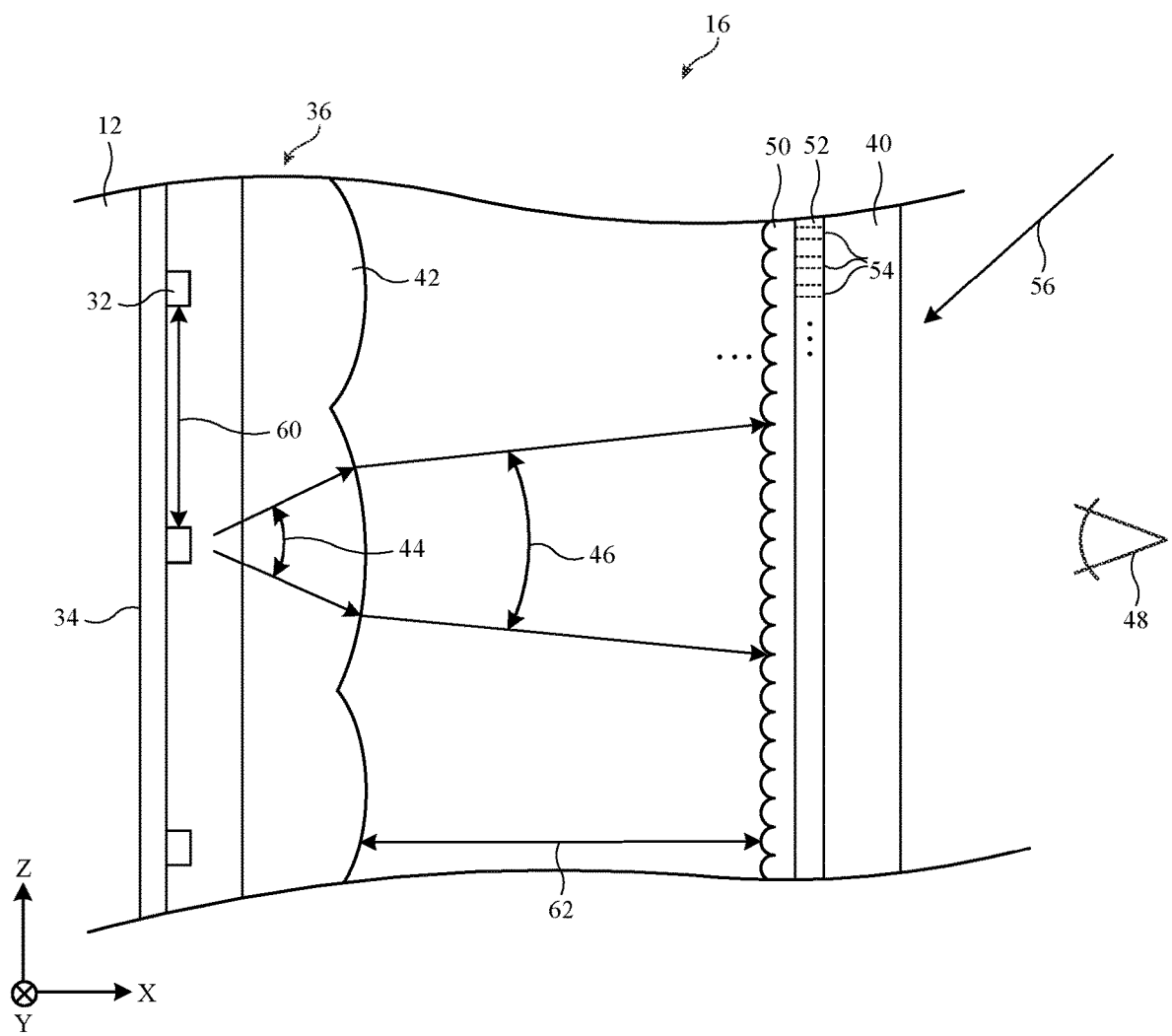
FIG. 2 is a cross-sectional side view of an illustrative display with a one-way filter in accordance with an embodiment.

FIG. 2 is a cross-sectional side view of an illustrative exterior display for vehicle 10. Display 16 of FIG. 2 may be mounted to body 12. Body 12 may have a cavity that receives display 16, display 16 may be attached to an outer surface of body 12, and/or display 16 may be otherwise supported by body 12. Display 16 may optionally have a housing formed separately from body 12. As shown in FIG. 2, display 16 may include light sources 32 on a substrate 34. Light sources 32 may be light-emitting diodes (LEDs) such as organic light-emitting diodes (OLEDs) or inorganic LEDs, lasers, lamps, etc. Substrate 34 may be a printed circuit or other desired substrate.

Light sources 32 may include light sources of a single color (e.g., blue LEDs or white LEDs) or light sources of multiple colors (e.g., red, blue, and green LEDs). In arrangements in which light sources 32 include different color light sources, light color may be adjusted by selectively activating and deactivating light sources 32.

The light sources 32 emit light that travels in the positive X-direction through collimator 36, one-way filter 38, and cover layer 40. Cover layer 40 (sometimes referred to as display cover layer 40, transparent cover layer 40, etc.) may be formed from a transparent material such as glass, plastic, sapphire, etc. The cover layer may have a transparency that is greater than 80%, greater than 90%, greater than 95%, greater than 99%, etc.

Light collimator 36 may be formed from one or more optical components such as illustrative collimating lenses 42. In FIG. 2, each light source 32 is covered by a respective collimating lens 42. Each collimating lens 42 collimates light for a respective light source 32. The light collimator 36 in FIG. 2 is formed using refraction-based lenses. However, this example is merely illustrative and other types of light collimators may be used if desired. For example, collimator 36 may include reflective structures such as conical mirrors, structures that propagate light using total internal reflection such as light pipes, etc.

As shown in FIG. 2, light sources 32 may emit light with a first angular spread 44 (sometimes referred to as viewing angle). The total magnitude of viewing angle 44 may be greater than 45 degrees, greater than 60 degrees, greater than 70 degrees, greater than 80 degrees, greater than 90 degrees, etc. Light collimator 36 collimates the light from each light source, thereby reducing the angular spread of the light. As shown in FIG. 2, after passing through light collimator 36, the light from each light source 32 has a second angular spread 46 (sometimes referred to as viewing angle 46). The total magnitude of viewing angle 46 may be less than 40 degrees, less than 30 degrees, less than 25 degrees, less than 20 degrees, less than 10 degrees, etc.

The light that is collimated by collimator 36 is then incident on one-way filter 38. One-way filter 38 may allow the majority of the collimated light from light sources 32 to pass through the filter in the positive X-direction (e.g., to a viewer 48). The light from light sources 32 may sometimes be referred to as display light. In addition to passing the majority of display light in the positive X-direction, one-way filter 38 may block the majority of ambient sunlight 56 from reflecting off of the display and washing out the display light. To achieve the desired filtering, one-way filter 38 includes a microlens array 50 and a masking layer 52 (sometimes referred to as mask 52, light blocking layer 52, light absorbing layer 52, etc.).

Masking layer 52 may be formed from a light absorbing material that has a plurality of holes 54 (sometimes referred to as openings 54, pinholes 54, etc.). Each hole 54 may be aligned with a respective microlens in microlens array 50. Each microlens in the microlens array receives collimated light from collimator 36 and focuses the collimated light through a respective hole 54. In this way, the display light passes through masking layer 52 and reaches viewer 48.

Ambient sunlight 56, meanwhile, strikes the masking layer 52. The majority of the sunlight will strike the non-hole area of the masking layer and be blocked (e.g., absorbed). Some amount of sunlight may still pass through holes 54 and be reflected back towards viewer 48. However, the amount of ambient light reflections is sufficiently small to preserve a high contrast between the display light and reflections of the ambient sunlight (even in bright sunlight).

An alternative technique for mitigating ambient sunlight reflections is to include a heavily tinted layer in display 16. However, the heavily tined layer may mitigate the brightness of the display light in addition to ambient sunlight reflections. The one-way filter of the display in FIG. 2 mitigates the amount of attenuated display light, which improves the efficiency of display 16 (e.g., reduces power consumption).

Figure 3:
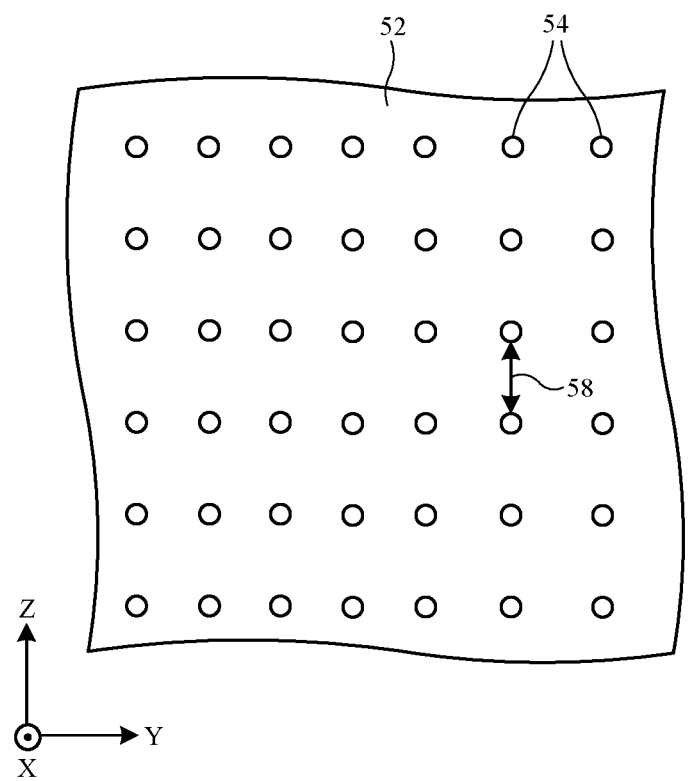
FIG. 3 is a front view of an illustrative masking layer in a one-way filter in accordance with an embodiment.

FIG. 3 is a front view of masking layer 52 in FIG. 2. As shown, the masking layer includes an array of holes 54. Each hole 54 may be aligned with a respective microlens in microlens array 50. The masking layer may be formed from a black material that absorbs light. For example, the masking layer may absorb more than 80% of incident light, more than 90% of incident light, more than 95% of incident light, more than 99% of incident light, etc.

The appearance of the masking layer may dictate the off state cosmetic appearance of display 16. When the display is on, the content formed by display light from display 16 will be viewable. However, when the display is off, masking layer 52 will be viewable through cover layer 40. When the display is formed from a black light absorbing material, the display will appear to be black when turned off. The masking layer may be formed from other materials to provide display 16 with a difference appearance in its off state. As one example, the masking layer 52 may be formed from a material with a high specular reflection. In specular reflection, incident light at a given incident angle is reflected at the same (or similar angle). Since the sun is normally positioned at a high angle relative to the display, specular reflection may cause ambient light from the sun to be reflected into the ground (where it is not visible to viewer 48 in FIG. 2). Therefore, even though the masking layer does not absorb the light in this scenario, the masking layer prevents (blocks) ambient sunlight from reaching the viewer (which ensures a high contrast in the display). When a display having a masking layer 52 with high specular reflection is in the off state, the display may have a mirror-like appearance. Masking layer 52 may also be formed from a light absorbing material having a non-black color (e.g., red, blue, purple, yellow, etc.) if desired. Masking layer 52 may also have different portions with different colors/appearances (e.g., a central portion of a first color and a peripheral ring-shaped portion with a second color, a left half of a first color and a right half with a second color, etc.).

If care is not taken, holes 54 in masking layer 52 may be visible to a viewer when the display is in the off state. To prevent this, the diameter of holes 54 and the pitch 58 between adjacent holes (e.g., the center-to-center spacing in the Y-direction and/or Z-direction) may be small. The diameter of holes 54 may be less than 0.2 millimeters, less than 0.1 millimeters, less than 0.5 millimeters, less than 0.1 millimeters, greater than 0.1 millimeters, etc. Pitch 58 may be less than 1 millimeter, less than 0.5 millimeters, less than 0.3 millimeters, less than 0.2 millimeters, less than 0.1 millimeters, between 0.2 millimeters and 0.3 millimeters, between 0.1 millimeter and 0.5 millimeters, etc. The smaller the pitch, the closer a viewer has to be to display 16 to be able to detect the presence of holes 54. For example, at a pitch of 0.25 millimeters, holes 54 may not be detectable to the average human eye at about a 1-meter viewing distance.

In addition to mitigating the detectability of the holes when the display is off, using a small magnitude for pitch 58 prevents a screen door effect (a black mesh that is viewable between light-emitting areas) when display 16 is on. For example, at a pitch of 0.25 millimeters, a viewer may not be able to detect discrete light-emitting areas in the display (and instead perceive a continuous light-emitting area despite the fact that light only exits the display through holes 54) at about a 1-meter viewing distance.

The pitch of holes 54 is the same as the pitch of the microlenses in microlens array 50 (since each hole is aligned with a single respective microlens). The pitch of holes 54 may be lower than the pitch of light sources 32. As shown in FIG. 2, light sources 32 may have a center-to-center spacing 60 (sometimes referred to as pitch 60). Pitch 60 may be greater than 1 millimeter, greater than 2 millimeters, greater than 3 millimeters, greater than 5 millimeters, between 2 millimeters and 3 millimeters, between 0.1 millimeter and 10 millimeters, less than 1 millimeter, less than 2 millimeters, less than 3 millimeters, less than 5 millimeters, etc. The ratio of pitch 60 to pitch 58 may be greater than 2, greater than 3, greater than 5, greater than 8, greater than 10, greater than 20, less than 2, less than 3, less than 5, less than 8, less than 10, less than 20, greater than 0.5, greater than 0.1, less than 0.5, less than 0.1, etc.

The total percent surface area taken up by holes 54 in masking layer 52 may be less than 20%, less than 15%, less than 10%, less than 5%, greater than 15%, greater than 10%, greater than 5%, greater than 1%, between 5% and 15%, etc. Take an example where the total percent surface area of holes 54 in masking layer 52 is 10%. This means that 90% of incident ambient sunlight will be blocked by masking layer 52. The majority of the display light is focused through the holes, resulting in a high contrast between display light and reflected sunlight.

As shown in FIG. 2, there may be an air gap 62 between collimator 36 and one-way filter 38. The magnitude of air gap 62 may be greater than 1 millimeter, greater than 3 millimeters, greater than 5 millimeters, greater than 10 millimeters, greater than 15 millimeters, between 10 millimeters and 15 millimeters, less than 20 millimeters, less than 15 millimeters, less than 10 millimeters, etc. If desired, a transparent filler (e.g., a low-index filler) may be used to fill air gap 62. The transparent filler may conform to the surfaces of collimator 36 and microlens array 50.

Figure 4:
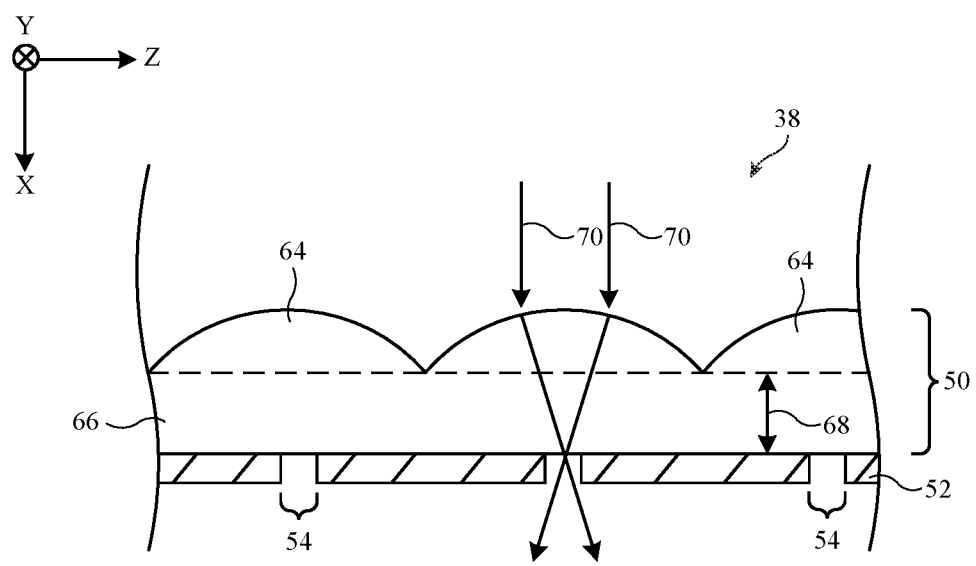
FIG. 4 is a cross-sectional side view of an illustrative one-way filter in accordance with an embodiment.

FIG. 4 is a cross-sectional side view of one-way filter 38 from FIG. 2. As shown in FIG. 4, the one-way filter 38 includes a microlens array 50 and a masking layer 52. Microlens array 50 includes microlenses 64 and a spacer layer 66. Microlenses 64 are formed on a first side of spacer layer 66 and masking layer 52 is formed on a second, opposing side of spacer layer 66.

Microlenses 64 and spacer layer 66 may be formed from the same material or from different materials. Microlenses 64 and spacer layer 66 may be formed during a single manufacturing step (e.g., molded from a single material) or during multiple manufacturing steps.

Masking layer 52 may be formed by molding (e.g., a two-shot mold with microlens array 50), printing, one or more thin films (foils) that are attached to the microlens array, etc.

Spacer layer 66 may have a thickness 68 that matches the focal length of microlenses 64. In this way, microlenses 64 focus light onto respective focal points (e.g., in a focal plane) that align with masking layer 52. As shown in FIG. 4, collimated light 70 received by the microlens array is focused through holes 54 and passes through the masking layer 52. Thickness 68 may be less than 1 millimeter, less than 0.5 millimeters, less than 0.3 millimeters, less than 0.2 millimeters, less than 0.1 millimeters, between 0.2 millimeters and 0.3 millimeters, between 0.1 millimeter and 0.5 millimeters, etc. The magnitude of thickness 68 may be within 20% of the focal length of microlenses 64, within 10% of the focal length of microlenses 64, within 5% of the focal length of microlenses 64, within 3% of the focal length of microlenses 64, etc.

The shape (and corresponding focal length) of microlenses 64 may be tuned to determine the viewing angle of light output from display 16. Microlenses with small amounts of curvature (and a corresponding larger focal length) result in a smaller viewing angle in the light output from display 16. Microlenses with large amounts of curvature (and a corresponding smaller focal length) result in a larger viewing angle in the light output from display 16.

As previously mentioned, forming the holes in masking layer 52 with a small pitch may mitigate screen door effect in the display. Additionally, the screen door effect is mitigated because each microlens serves as a diffusing element that diffuses the light from light sources 32.

Figure 5:
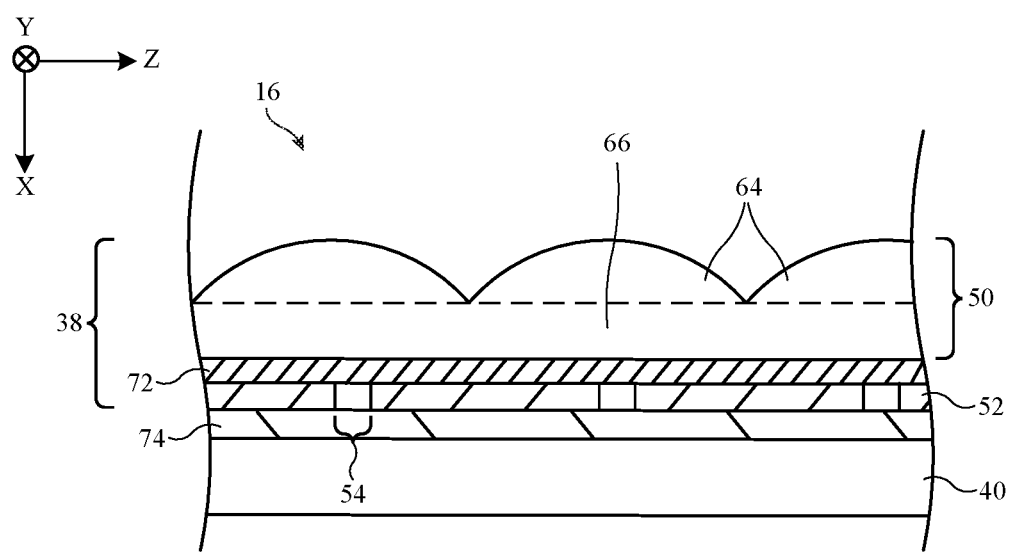
FIG. 5 is a cross-sectional side view of an illustrative display with a one-way filter and a color conversion layer in accordance with an embodiment.

If desired, one or more additional layers may optionally be incorporated into one-way filter 38 and/or display 16. FIG. 5 is a cross-sectional side view of an illustrative display with a color conversion layer. As shown in FIG. 5, color conversion layer 72 may be interposed between spacer layer 66 and masking layer 52. The color conversion layer 72 (sometimes referred to as phosphor layer 72, quantum dot layer 72, etc.) may convert light of a first color into light of a second, different color. For example, the color conversion layer may convert blue light from light sources 32 into white light that is emitted from the display. The color conversion layer may include quantum dots such as red quantum dots (that convert blue light into red light) and green quantum dots (that convert blue light into green light). Color conversion layer 72 may be a blanket layer that covers the entire masking layer 52. Alternatively, color conversion layer 72 may be patterned to provide display 16 with different colors of emitted light in different portions of the display. For example, the color conversion layer 72 may be formed over only a first half of the display but not a second half of the display. Alternatively, the color conversion layer 72 may output a first color of light in a first half of the display and a second, different color of light in a second half of the display.

FIG. 5 also shows how a filter layer 74 may optionally be included in display 16. The filter layer is interposed between masking layer 52 and cover layer 40. Filter layer 74 may filter one or more colors of light, as an example. The filter layer may filter (block) one or more colors of visible light and/or light at other wavelengths (e.g., infrared light, ultraviolet light, etc.). The filter layer may have anisotropic performance based on the incident angle of light. For example, the filter layer may pass more light at on-axis incident angles (e.g., light that is orthogonal to the surface of filter 74) than at off-axis incident angles (e.g., light that is at a shallow angle relative to the surface of filter 74). This type of anisotropic filtering may allow display light (from light sources 32) to pass through the filter while blocking light at other viewing angles.

Figure 6:
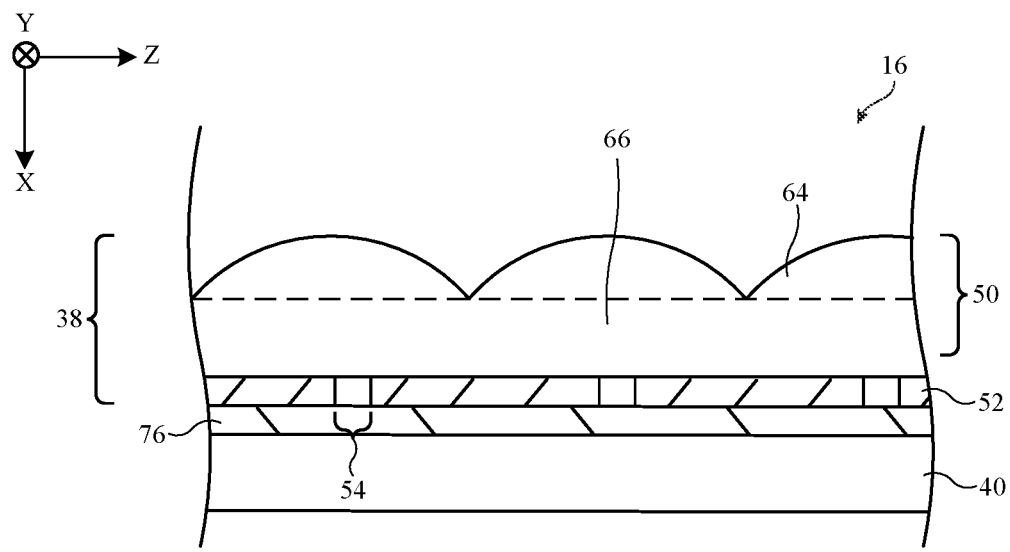
FIG. 6 is a cross-sectional side view of an illustrative display with a one-way filter and a diffuser layer in accordance with an embodiment.

FIG. 6 is a cross-sectional side view of an illustrative display with a diffuser layer in addition to a one-way filter. As shown in FIG. 6, the diffuser layer 76 is positioned between masking layer 52 and cover layer 40. The diffuser layer 76 may provide additional diffusion of light from display 16 to mitigate the screen door effect in the display. Diffuser layer 76 may be susceptible to diffuse reflections from sunlight that reduce contrast in display 16. Therefore, diffuser layer 76 may have a relatively low haze to prevent excessive sunlight reflections. Haze may be measured as the percentage of incident light scattered by more than 2.5 degrees through the material. The haze of diffuser layer 76 may be less than 40%, less than 30%, less than 20%, less than 10%, less than 5%, between 1% and 20%, etc.

Figure 7:
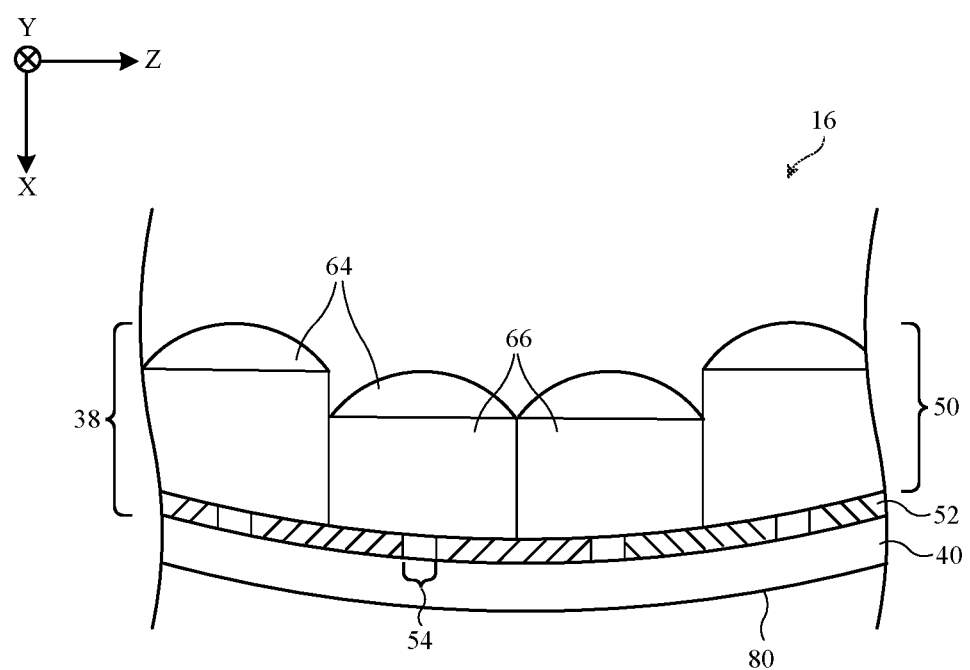
FIG. 7 is a cross-sectional side view of an illustrative display with non-planar layers in accordance with an embodiment.

In FIGS. 2 and 4-6, the output surface of display 16 (e.g., the exterior surface of cover layer 40) is depicted as being planar. This example is merely illustrative. If desired, the display may have a non-planar output surface. Any or all of the components in the display may have a non-planar shape that conforms to the non-planar output surface. FIG. 7 is a cross-sectional side view of an illustrative display with a convex output surface. As shown in FIG. 7, cover layer 40 has an outer surface 80 with convex curvature. Masking layer 52 has convex curvature that conforms to the curvature of cover layer 40. This example is merely illustrative. The outer surface 80 may have concave curvature or other desired curvature (e.g., curvature with both convex and concave portions).

When the display has a non-planar output surface, spacer layer 66 in microlens array 50 may have different portions with different thicknesses. Each spacer layer portion has a corresponding microlens 64. Including different spacer layer portions allows for the thickness of each spacer layer to be tuned to ensure that the focal point of each microlens aligns with a respective opening 54 in the masking layer 52.

Figure 8:
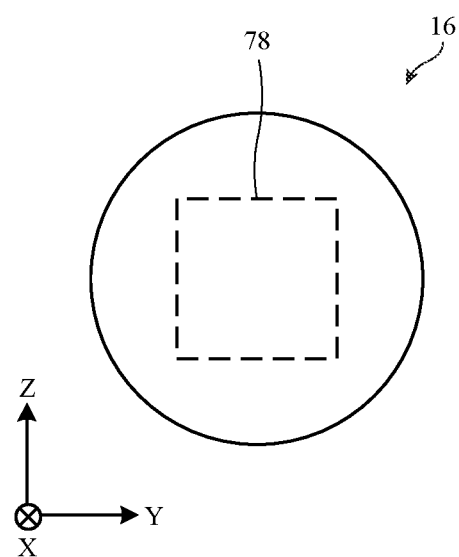
FIG. 8 is a front view of an illustrative display in accordance with an embodiment.

FIG. 8 is a front view of an illustrative display 16 that may be included in vehicle 10. As shown in FIG. 8, the display may have a circular footprint. This example is merely illustrative. In general, display 16 may have any desired footprint (e.g., square, non-square rectangular, oval, etc.). Display 16 may be used to display a symbol 78, an animation of a symbol, text, or any other desired content. As previously discussed, symbol 78 may correspond to an intended action for vehicle 10 (e.g., a square when the vehicle is stopped or stopping, a triangle when the vehicle is moving without intending to stop) and/or instructions to nearby pedestrians (e.g., a raised hand when pedestrians should not cross in front of the vehicle, a walking person when pedestrians should cross in front of the vehicle, etc.).

The foregoing is merely illustrative and various modifications can be made to the described embodiments. The foregoing embodiments may be implemented individually or in any combination.

What is claimed is:

1. A display, comprising:
an array of light-emitting diodes configured to emit light;
a collimator that is configured to collimate the light;
a masking layer that includes a plurality of holes, wherein the masking layer has first and second opposing sides and wherein the masking layer is configured to block a majority of ambient light from passing from the second side to the first side;
a microlens array layer that is configured to focus a majority of the light from the collimator through the plurality of holes from the first side to the second side;
a spacer layer having different portions with different thicknesses, wherein the spacer layer is interposed between the masking layer and the microlens array layer, and
a transparent cover layer having a non-planar exterior surface, wherein the masking layer is interposed between the spacer layer and the transparent cover layer.

2. The display defined in claim 1, wherein each microlens in the microlens array layer is on a respective one of the different portions of the spacer layer.

3. The display defined in claim 2, wherein each one of the different portions of the spacer layer has a non-planar side that conforms to the masking layer and a planar side that is adjacent to the microlens array layer.

4. The display defined in claim 3, wherein the non-planar exterior surface of the transparent cover layer has convex curvature.

5. The display defined in claim 4, wherein the masking layer conforms to the transparent cover layer.

6. The display defined in claim 1, wherein the microlens array layer and the masking layer form a one-way filter.

7. The display defined in claim 6, wherein the one-way filter passes a majority of light from the array of light-emitting diodes in a first direction away from the array of light-emitting diodes.

8. The display defined in claim 1, wherein each microlens of the microlens array layer has a focal point that is aligned with a respective hole of the plurality of holes.

9. The display defined in claim 1, wherein a first center-to-center spacing of the plurality of holes is less than a second center-to-center spacing of the array of light-emitting diodes.

10. The display defined in claim 9, wherein the first center-to-center spacing is less than 0.3 millimeters and wherein the second center-to-center spacing is greater than 1 millimeter.

11. The display defined in claim 1, further comprising:
a color conversion layer that is interposed between the microlens array layer and the masking layer, wherein the color conversion layer is configured to convert the light from the array of light-emitting diodes from a first color to a second, different color.

12. A display, comprising:
a plurality of light sources;
a collimator that is configured to collimate light from the plurality of light sources;
a microlens array layer that includes a plurality of microlenses, wherein the collimator is interposed between the plurality of light sources and the microlens array layer;
a masking layer that includes a plurality of holes, wherein the microlens array layer is interposed between the collimator and the masking layer and wherein each microlens of the plurality of microlenses is aligned with a respective hole of the plurality of holes;

a transparent cover layer, wherein the masking layer is interposed between the transparent cover layer and the microlens array layer; and an anisotropic filtering layer that is interposed between the transparent cover layer and the masking layer, wherein the anisotropic filter layer passes more light at an on-axis incident angle than at an off-axis incident angle.

13. The display defined in claim 12, wherein the microlens array layer and the masking layer form a one-way filter.

14. The display defined in claim 13, wherein the one-way filter passes a majority of light from the plurality of light sources in a first direction away from the plurality of light sources.

15. The display defined in claim 12, wherein a first center-to-center spacing of the plurality of holes is less than a second center-to-center spacing of the plurality of light sources.

16. The display defined in claim 15, wherein the first center-to-center spacing is less than 0.3 millimeters and wherein the second center-to-center spacing is greater than 1 millimeter.

17. The display defined in claim 12, further comprising:
a color conversion layer that is interposed between the microlens array layer and the masking layer, wherein the color conversion layer is configured to convert the light from the plurality of light sources from a first color to a second, different color.

* * * * *